US010534885B1

(12) United States Patent
Datta et al.

(10) Patent No.: US 10,534,885 B1
(45) Date of Patent: Jan. 14, 2020

(54) MODIFYING DATA FLOW GRAPHS USING RANGE INFORMATION

(71) Applicant: Xilinx, Inc., San Jose, CA (US)

(72) Inventors: Sumanta Datta, Hyderabad (IN); Anup Hosangadi, San Jose, CA (US); Aman Gayasen, Hyderabad (IN)

(73) Assignee: XILINX, INC., San Jose, CA (US)

( * ) Notice: Subject to any disclaimer, the term of this patent is extended or adjusted under 35 U.S.C. 154(b) by 111 days.

(21) Appl. No.: 15/927,831

(22) Filed: Mar. 21, 2018

(51) Int. Cl.
*G06F 17/50* (2006.01)

(52) U.S. Cl.
CPC ...... *G06F 17/5054* (2013.01); *G06F 17/5068* (2013.01)

(58) Field of Classification Search
CPC .............. G06F 17/5045; G06F 17/505; G06F 17/5054; G06F 17/5068; G06F 17/5022; G06F 17/5031; G06F 17/5036; G06F 17/5059; G06F 17/5072; G06F 17/5081; G06F 17/509; G06F 19/3418; G06F 2217/02; G06F 2217/06; G06F 2217/08; G06F 2217/68; G06F 2217/84; G06F 8/433; G06F 8/443; G06F 9/44
See application file for complete search history.

(56) References Cited

U.S. PATENT DOCUMENTS

| | | | |
|---|---|---|---|
| 6,625,797 B1 | 9/2003 | Edwards et al. | |
| 8,781,995 B2 * | 7/2014 | Stergiou | G06F 19/3418 706/62 |
| 8,826,255 B1 * | 9/2014 | Avadhanula | G06F 8/433 717/154 |
| 9,619,601 B1 | 4/2017 | Villarreal et al. | |
| 2003/0061577 A1 * | 3/2003 | Saluja | G06F 8/443 716/103 |
| 2004/0088666 A1 * | 5/2004 | Poznanovic | G06F 17/5045 716/105 |
| 2004/0225970 A1 * | 11/2004 | Oktem | G06F 17/505 716/114 |

(Continued)

OTHER PUBLICATIONS

IEEE, "IEEE Standard for SystemVerilog—Unified Hardware Design, Specification, and Verification Language," IEEE Std 1800™-2012, Feb. 21, 2013, pp. 1-1315, IEEE, New York, New York, USA.

(Continued)

*Primary Examiner* — Nha T Nguyen
(74) *Attorney, Agent, or Firm* — LeRoy D. Maunu

(57) ABSTRACT

Range information is determined for each variable of a circuit design. The range information is propagated from inputs to outputs of nodes of a DFG representation of the circuit design. For each multiplexer of the circuit design represented as a multiplexer node in the DFG, whether range information associated with a selector input of the multiplexer node restricts selection of data inputs of the multiplexer node to only one selected data input of the multiplexer node is determined. In response to determining that range information associated with the selector input restricts selection of data inputs to only one data input, the DFG is modified by connecting the selected data input to each load of the multiplexer node, and removing the multiplexer node, a corresponding select logic node of the multiplexer node, and nodes connected to unselected data inputs of the multiplexer node.

20 Claims, 10 Drawing Sheets

(56) References Cited

U.S. PATENT DOCUMENTS

| | | | | |
|---|---|---|---|---|
| 2007/0168902 A1* | 7/2007 | Ogawa | ............... | G06F 17/5045 |
| | | | | 716/103 |
| 2007/0174804 A1* | 7/2007 | Sasao | ................. | G06F 17/5054 |
| | | | | 716/103 |
| 2010/0125820 A1* | 5/2010 | Ispir | ..................... | G06F 17/505 |
| | | | | 716/132 |
| 2011/0113392 A1* | 5/2011 | Chakraborty | ......... | G06F 17/505 |
| | | | | 716/102 |
| 2014/0347096 A1* | 11/2014 | Afshar | .............. | H03K 19/1737 |
| | | | | 326/41 |
| 2016/0070844 A1* | 3/2016 | Shyamsukha | ....... | G06F 17/5081 |
| | | | | 716/113 |
| 2016/0299998 A1* | 10/2016 | Isshiki | ................. | G06F 17/505 |
| 2017/0017747 A1* | 1/2017 | Cho | ................... | G06F 17/5045 |
| 2018/0165400 A1* | 6/2018 | Feld | ................... | G06F 17/5054 |

OTHER PUBLICATIONS

IEEE, "IEEE Standard VHDL Language Reference Manual," IEEE Std 1076™-2008, Jan. 26, 2009, pp. 1-640, IEEE, New York, New York, USA.

* cited by examiner

US 10,534,885 B1

MODIFYING DATA FLOW GRAPHS USING RANGE INFORMATION

TECHNICAL FIELD

The disclosure generally relates to modifying data flow graphs using range information.

BACKGROUND

Logic synthesis tools generate a data flow graph (DFG), which is a graphical representation of a circuit design described by register-transfer level (RTL) code. A DFG includes nodes that represent circuit elements to execute the RTL code. Functions in RTL code correspond to a respective set of nodes in the DFG. However, based on semantics in the RTL code, one or more of those nodes may be unnecessary. Manually examining a DFG to identify unnecessary nodes and revising the corresponding RTL code to generate a DFG without the unnecessary nodes is error prone and unwieldy. The revised RTL code is difficult to maintain and becomes "bloated" with extra lines of code and definitions.

SUMMARY

A disclosed method includes performing, by a programmed computer, operations including determining range information for each variable of a circuit design. The operations include propagating the range information from inputs to outputs of nodes of a data flow graph (DFG) representation of the circuit design. The operations include, for each multiplexer of the circuit design represented as a respective multiplexer node in the DFG, determining whether range information associated with a selector input of the multiplexer node restricts selection of data inputs of the multiplexer node to only one selected data input of the multiplexer node. The operations include, in response to determining that range information associated with the selector input restricts selection of data inputs of the multiplexer node to only one data input, modifying the DFG by connecting the selected data input of the respective multiplexer node to each load of the respective multiplexer node and removing from the DFG, the respective multiplexer node, a corresponding select logic node of the respective multiplexer node, and one or more nodes connected to one or more unselected data inputs of the respective multiplexer node.

A disclosed method includes performing, by a programmed computer, operations including determining range information for each variable of a circuit design. The operations include propagating the range information from inputs to outputs of nodes of a data flow graph (DFG) representation of the circuit design. The operations include determining each modulus node in the DFG that corresponds to a modulus operation in the circuit design. The operations include, for a modulus node in the DFG, from the range information associated with a divisor input that corresponds to a divisor of the modulus node, determining whether the range information specifies a divisor that is always a power of two. The operations include, in response to determining that the range information of the divisor input that corresponds to the divisor input specifies a divisor that is always a power of two, modifying the DFG by replacing the modulus node with a multiplexer node having a plurality of data inputs and a selector input connected to the divisor input, and a plurality of AND nodes, each AND node having a first input coupled to receive a dividend of the modulus operation, a second input coupled to receive a constant value that is one of possible values of the divisor minus 1, and an output coupled to a data input of the multiplexer node.

A disclosed system includes a computer system including a processor; and a memory configured with instructions that when executed by the processor cause the processor to perform operations including determining range information for each variable of a circuit design. The operations include propagating the range information from inputs to outputs of nodes of a data flow graph (DFG) representation of the circuit design. The operations include determining each divide node in the DFG that corresponds to a divide operation in the circuit design. The operations include determining for a divide node, from the range information associated with a divisor input that corresponds to a divisor of the divide node, whether the range information specifies a divisor that is always a power of two. The operations include, in response to determining that the range information of the input that corresponds to the divisor of the divide operation specifies a divisor that is always a power of two, modifying the DFG by replacing the divide node with a multiplexer node having a plurality of data inputs and a selector input connected to the divisor input, and a plurality of right-shift nodes, each right-shift node having a first input coupled to receive a dividend of the divide operation, a second input coupled to receive a constant value that is one of possible values of the divisor minus 1, and an output coupled to a data input of the multiplexer node.

Other features will be recognized from consideration of the Detailed Description and Claims, which follow.

BRIEF DESCRIPTION OF THE DRAWINGS

Various aspects and features of the method and system will become apparent upon review of the following detailed description and upon reference to the drawings in which.

DETAILED DESCRIPTION

Figure 1:
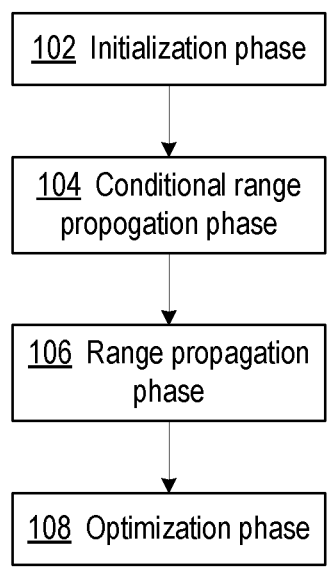
FIG. 1 shows a flowchart of an exemplary process for optimizing a DFG using range information.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

A DFG is generated from RTL code. The DFG includes nodes that correspond to pre-determined sets of circuit elements that correspond to function calls and statements in the RTL code. Semantics of the RTL code, such as variable types and value ranges, may render one or more circuit elements of the set of circuit elements unnecessary. For example, multiplexer and negate nodes may be included in a DFG to effectively perform an absolute value operation when the associated RTL code includes variables. Constraints on the value(s) of variables defined in the RTL code may prevent the value from being a negative number. As a result, the multiplexer and negate nodes are unnecessary. Removing unnecessary nodes from a DFG can yield significant improvement in the quality of result (QoR) in a resulting circuit design. For example, the quantity of look-up tables (LUTs) can be reduced by 95-98% and/or the quantity of logic levels can be reduced by 82-97%.

The disclosed approaches provide automated methods and systems that enable circuit designers to optimize DFGs of circuit designs and thereby improve the resulting circuitry. The disclosed methods and systems optimize DFGs of circuit designs in an opportunistic manner by modifying the DFG to eliminate unnecessary nodes. A programmed computer determines range information for each variable of a circuit design. The computer propagates the range information from inputs to outputs of nodes of a DFG representation of the circuit design. For each multiplexer of the circuit design represented as a respective multiplexer node in the DFG, the computer determines whether range information associated with a selector input of the multiplexer node restricts selection of data inputs of the multiplexer node to only one selected data input of the multiplexer node. In response to determining that range information associated with the selector input restricts selection of data inputs of the multiplexer node to only one data input, the computer modifies the DFG. The selected data input of the respective multiplexer node is connected to each load of the respective multiplexer node. The respective multiplexer node, a corresponding select logic node, and nodes connected to unselected data inputs of the respective multiplexer node are removed from the DFG.

In another aspect, the computer determines each modulus node in the DFG; each modulus node corresponds to a modulus operation in the circuit design. For a modulus node in the DFG, the computer determines from the range information associated with a divisor input that corresponds to a divisor of the modulus node whether the range information specifies a divisor that is always a power of two. In response to determining that the range information of the divisor input specifies a divisor that is always a power of two, the computer modifies the DFG by replacing the modulus node. The modulus node is replaced with a multiplexer node having a plurality of data inputs and a selector input connected to the divisor input and a plurality of AND nodes. Each AND node has a first input coupled to receive a dividend of the modulus operation, a second input coupled to receive a constant value that is one of possible values of the divisor minus one, and an output coupled to a data input of the multiplexer node.

In yet another aspect, the computer determines each divide node in the DFG; each divide node corresponds to a divide operation in the circuit design. For a divide node in the DFG, the computer determines from the range information associated with a divisor input that corresponds to a divisor of the divide node, whether the range information specifies a divisor that is always a power of two. In response to determining that the range information of the divisor input specifies a divisor that is always a power of two, the computer modifies the DFG by replacing the divide node. The divide node is replaced with a multiplexer node having a plurality of data inputs and a selector input connected to the divisor input and a plurality of right-shift nodes. Each right-shift node has a first input coupled to receive a dividend of the divide operation, a second input coupled to receive a constant value that is one of the possible values of a power of two minus one (as the divisor is in power-of-two form), and an output coupled to a data input of the multiplexer node.

FIG. 1 shows a flowchart of an exemplary process for optimizing a DFG using range information. Optimizing a DFG in accordance with the present disclosure can be broken down into four phases. An Initialization phase 102 includes computing range information, such as a range of values, for each variable defined in RTL code of a circuit design. The range information is computed based on semantics (e.g., a data type) of the variables. For example, if semantics of a variable specifies a natural number data type, then the range of values for that variable would be limited to non-negative integers. The range information can include a minimum value and a maximum value for each variable. The range information is used as a constraint in a Conditional Range Propagation phase 104.

Conditional statements, such as if-else and if-else-if statements, in RTL code are represented as one or more multiplexer nodes in a DFG. In the Conditional-Range Propagation phase 104, the multiplexer nodes of the DFG are processed in topological order. For simplicity, the following describes a two-input multiplexer node (e.g., an if-else statement). The disclosed approaches are applicable to multiplexer nodes having more than two data inputs (e.g., an if-else-if). A first fan-in cone of the multiplexer node corresponds to the "true" condition of the if-else statement. A second fan-in cone of the multiplexer node corresponds to the "false" condition of the if-else statement. Each fan-in cone is referred to as a conditional block. Conditional blocks have a hierarchal structure representing nested if-else statements. The select logic cone of a multiplexer node represents the condition expression of the if-else statement. The range information computed in the Initialization phase 102 is propagated backwards through the select logic cone. For the "true" conditional block, the value of the select logic is set to "1" and the range information is propagated backwards through the select logic cone. For the "false" conditional block, the value of the select logic is set to "0" and the range information is propagated backwards through the select logic cone. In an alternative approach, the logic values for true and false can be reversed such that the "true" conditional block corresponds to the select logic being "0" and the "false" conditional block corresponds to the select logic being "1". The range information that is backwards propagated is referred to as a condition constraint set. An example of the Conditional-Range Propagation phase 104 is described in association with FIGS. 3 and 4 below. Identifying a conditional block can include traversing nodes of the DFG in reverse topological order starting from a data input of each node. Propagating the condition constraint set can include traversing the nodes of the DFG in reverse topological order starting from an output of the DFG.

In a Range Propagation phase 106, the range information is forwards propagated through the nodes of the DFG in topological order.

In an Optimization phase 108, the range information is used to optimize the DFG. Examples of optimizations of a DFG in accordance with the present disclosure are described in association with FIGS. 2-10 below.

Figure 2:
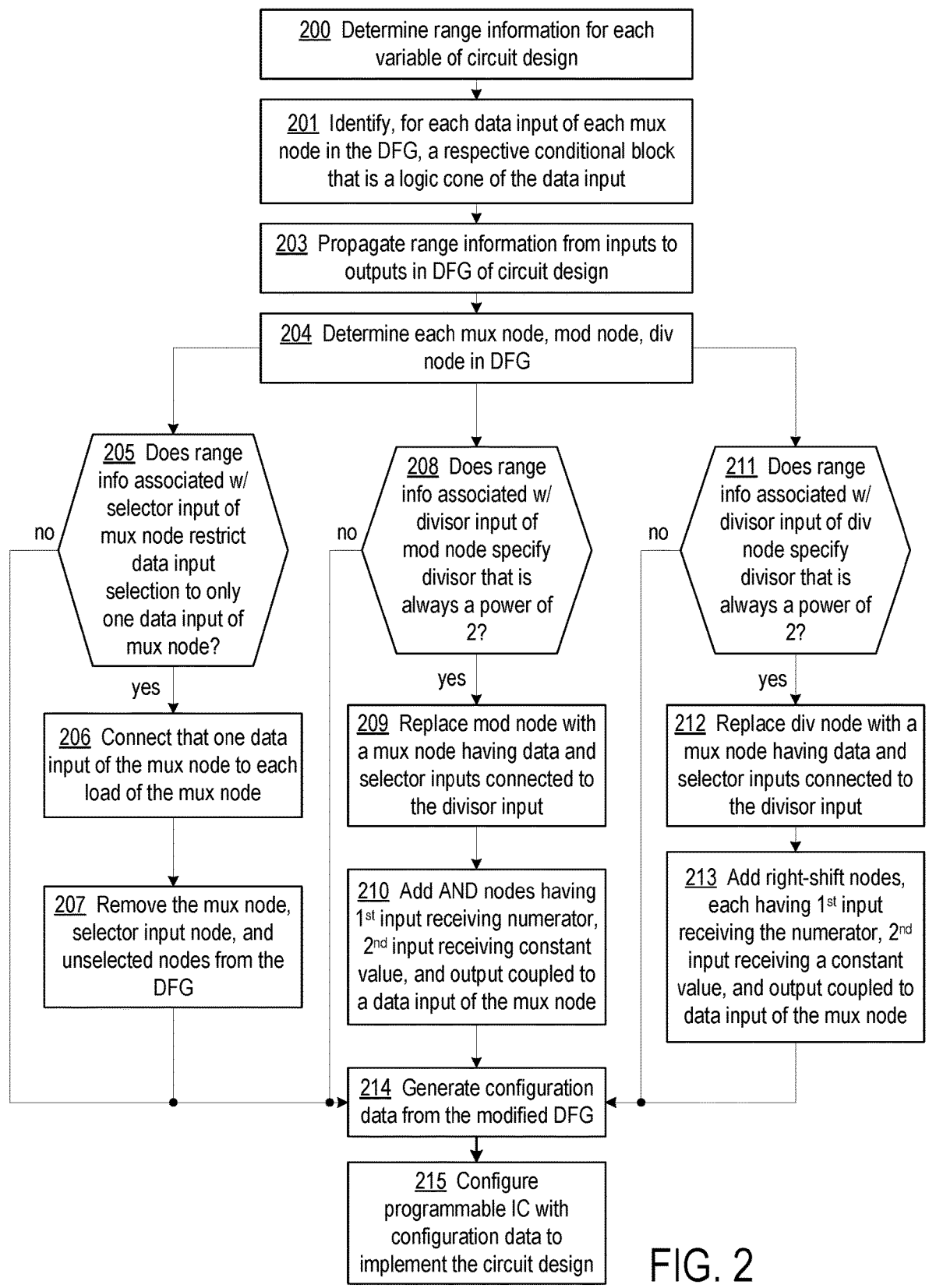
FIG. 2 shows a flowchart of an exemplary processes for optimizing a DFG using range information.

FIG. 2 shows a flowchart of an exemplary processes for optimizing a DFG using range information. At block 200, an electronic design automation (EDA) tool executing on a computer system determines range information for each variable of a circuit design. The circuit design can be described by RTL code. At block 201, for each data input of each multiplexer (mux) node in the DFG of the circuit design, the system identifies a respective conditional block, which is a logic cone (e.g., a fan-in cone) of a data input of a multiplexer node. At block 202, the system propagates the range information from inputs of the DFG to outputs of the DFG. At block 203, the system determines each multiplexer node, each modulus (mod) node, and each divide (div) node present in the DFG.

FIG. 2 shows three exemplary approaches for optimizing a DFG. One approach includes removing unnecessary multiplexer node(s) from the DFG (blocks 205, 206, and 207). Examples are described in association with FIGS. 3-6 below. Another approach includes optimizing modulus operation(s) in the DFG (blocks 208, 209, and 210). An example is described in association with FIGS. 7 and 8 below. Yet another approach includes optimizing divide operation(s) in the DFG (blocks 211, 212, and 213). An example described in association with FIGS. 9 and 10 below. Further description of the processing of FIG. 2 is interspersed with the description of FIGS. 3-10 below.

Figure 3:
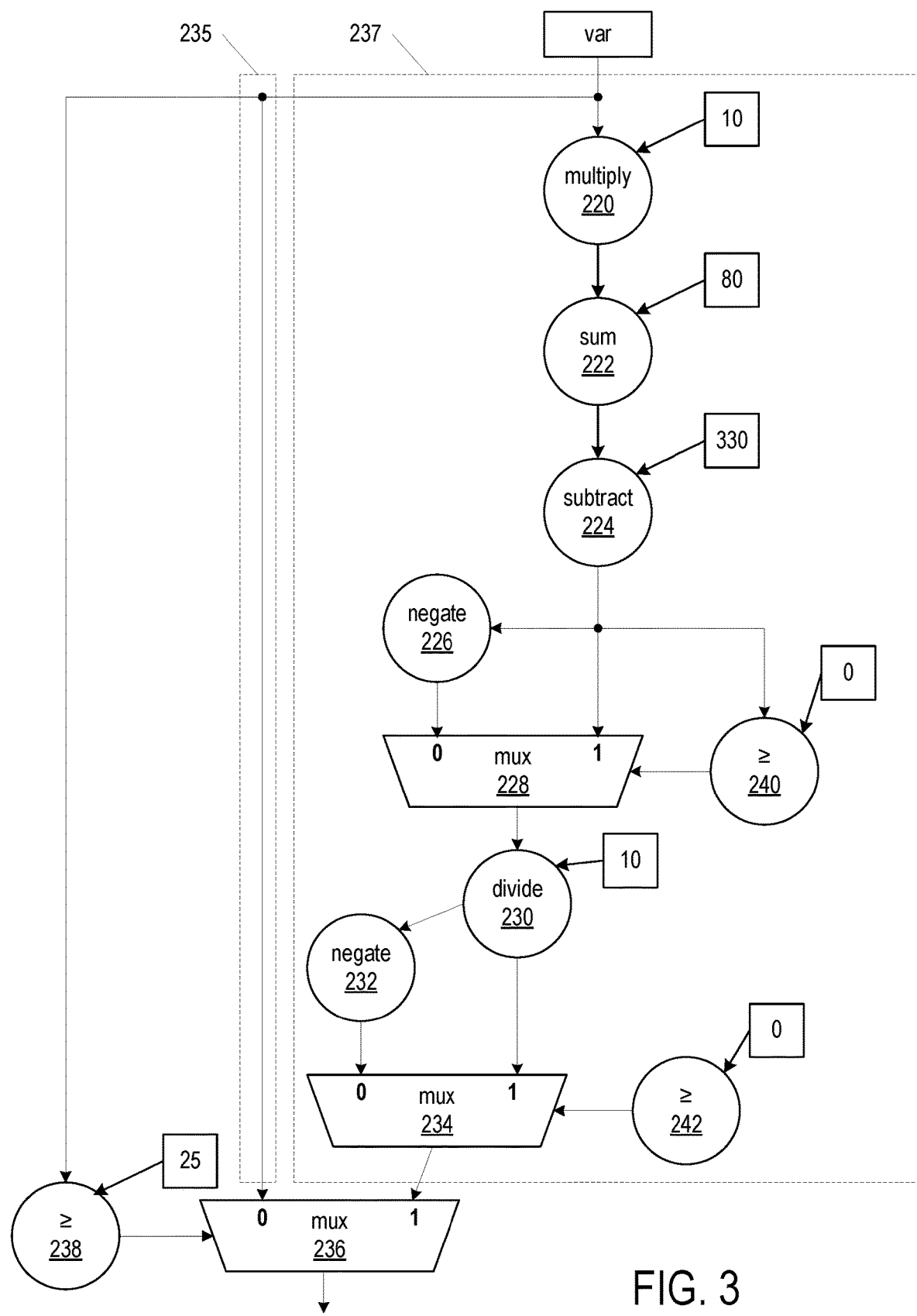
FIG. 3 is an exemplary DFG prior to optimization.

Referring now to FIG. 3, FIG. 3 is an exemplary DFG prior to optimization. The DFG shown in FIG. 3 is generated from the RTL code of Example 1.

const1 : natural:=330;
const2 : natural:=80;
const3 : natural:=10;
variable var: natural range 0 to (const1+const2)/const3−1;
if var>=(const1−const2)/const3 then
var:=(const3*var+const2−const1)/const3;
end if;

Example 1

The multiplexer node 236 corresponds to the if-else statement in the RTL code. The if-else statement determines whether the value of the variable "var" is greater than or equal to the value of the expression, (const1−const2)/const3. The values of const1, const2, and const3 are 330, 80, and 10, respectively. Thus, the if-else statement determines whether the value of "var" is greater than or equal to 25 (represented by the greater than or equal to node 238). If the value of "var" is greater than or equal to 25, then the select logic of the multiplexer node 236 selects the "true" data input ("1") and outputs a new value of var. The new value is defined by the expression, (const3*"var"+const2−const1)/const3. This expression is represented by the multiply node 220, the sum node 222, the subtract node 224, and the divide node 230. If the value of "var" is less than 25, then the select logic of the multiplexer node 236 selects the "false" data input ("0") and outputs the current value of var. The fan-in cone of the "false" data input ("0") of the multiplexer 236 is a conditional block 235. The fan-in cone of the "true" data input ("1") of the multiplexer 236 is a conditional block 237.

The RTL code specifies that "var" is a natural number. As a result, the DFG includes two other multiplexer nodes 228 and 234. The multiplexer node 228 determines whether the value of the dividend of the divide operation of the expression defining "var" is greater than or equal to zero. If the value of the dividend is greater than or equal to zero, then the multiplexer node 228 selects the "true" ("1") data input, which does not alter the value of the dividend. If the value of the dividend is less than zero, then the multiplexer node 228 selects the "false" data input ("0") connected to a negate node 226. The negate node 226 changes the sign of the value of the dividend from negative to positive. The multiplexer node 228, the greater-than-or-equal-to node 240, and the negate node 226 perform an absolute value operation on the value of the dividend.

Similarly, the multiplexer node 234 and the greater-than-or-equal-to node 242 effectively perform an absolute value operation on the result of the divide operation. The multiplexer node 234 determines whether the result of the divide operation is greater than or equal to zero. If the result is greater than or equal to zero, then the multiplexer node 234 selects the "true" ("1") data input, which does not alter the result. If the result is less than zero, then the multiplexer node 234 selects the "false" data input ("0"), which is connected to the output of negate node 232. The negate node 232 changes the sign of the result from negative to positive.

The RTL code also specifies a range of values for "var". The minimum value of "var" is zero, and the maximum value of "var" is (const1+const2)/const3−1. Thus, the maximum value of "var" is 40. In previous approaches, the range, 0 to 40, is propagated through the nodes of the DFG without taking account the conditional blocks 235 and 237 of the multiplexer node 236. After the multiply node 220, the range of values of "var" is 0 to 400. After the sum node 222, the range of values of "var" is 80 to 480. After the subtract node 224, the range of values of "var" is −250 to 150. Thus, in previous approaches it appears that the value of the dividend could be negative such that the multiplexer node 228, the greater-than-or-equal-to node 240, and the negate node 226 may be necessary. After the divide node 230, the range of values of "var" is −25 to 15. Thus, in previous approaches it appears that the value of "var" could be negative such that the multiplexer node 234, the greater-than-or-equal-to node 242, and the negate node 232 may be necessary.

Advantageously, the disclosed approaches take the conditional blocks 235 and 237 of the multiplexer node 236 into account and backwards propagates the condition constraint set through the nodes of the DFG. As described above, the "false" ("0") data input of the multiplexer 236 is selected only when the value of "var" is less than 25. Because the range of values of "var" is limited to 0 to 40, the "false" ("0") data input of the multiplexer 236 would be selected only when the value of "var" is in the range 0 to 24. The "true" ("1") data input of the multiplexer 236 is selected only when the value of "var" is greater than or equal to 25. Because the range of values of "var" is limited to 0 to 40, the "true" ("1") data input of the multiplexer 236 would be selected only when the value of "var" is in the range 25 to 40.

Turning again to FIG. 2, at decision block 205, the system determines whether range information associated with the selector input of a multiplexer node restricts selection of a data input of the multiplexer node to only one data input. Applying the condition constraint set to the conditional block 237, the initial range of values of "var" is 25 to 40.

After the multiply node 220, the range of values of "var" is 250 to 400. After the sum node 222, the range of values of "var" is 330 to 480. After the subtract node 224, the range of values of "var" is 0 to 150. Thus, the value of the dividend cannot be negative. Consequently, the multiplexer node 228 will always select the "true" ("1") data input. After the divide node 230, the range of values of "var" could be 0 to 15. Again, the value of "var" cannot be negative. Consequently, the multiplexer node 234 will always select the "true" ("1") data input.

Because the multiplexer nodes 228 and 234 will always select only one data input, in this case the "true" ("1") data input, the DFG can be optimized by removing the unnecessary nodes. In response to determining that the selector input of a multiplexer node restricts the selection of data inputs to only one data input, at block 206, the system connects the one selected data input of the multiplexer node to each load. In the illustrated example of FIG. 3, the "true" ("1") data input of the multiplexer node 228 (the output of the subtract node 224) is connected to the input of the divide node 230. The "true" ("1") data input of the multiplexer node 234 (the output of the divide node 230) is connected to the "true" ("1") data input of the multiplexer node 236.

At block 207, the system removes the multiplexer node, the selector logic node(s) of the multiplexer node, and the nodes connected to the unselected data inputs of the multiplexer node. In the illustrated example of FIG. 3, the multiplexer nodes 228 and 234, the greater-than-or-equal-to nodes 240 and 242, and the negate nodes 226 and 232 are removed from the DFG.

In response to determining, at decision block 205, that the range information associated selector inputs of the multiplexer nodes of the DFG does not restrict the selection of data inputs to only one data input, at block 215, the system generates configuration data from the optimized DFG. At block 216, the system configures a programmable IC with the configuration data to generate a functional circuit.

Figure 4:
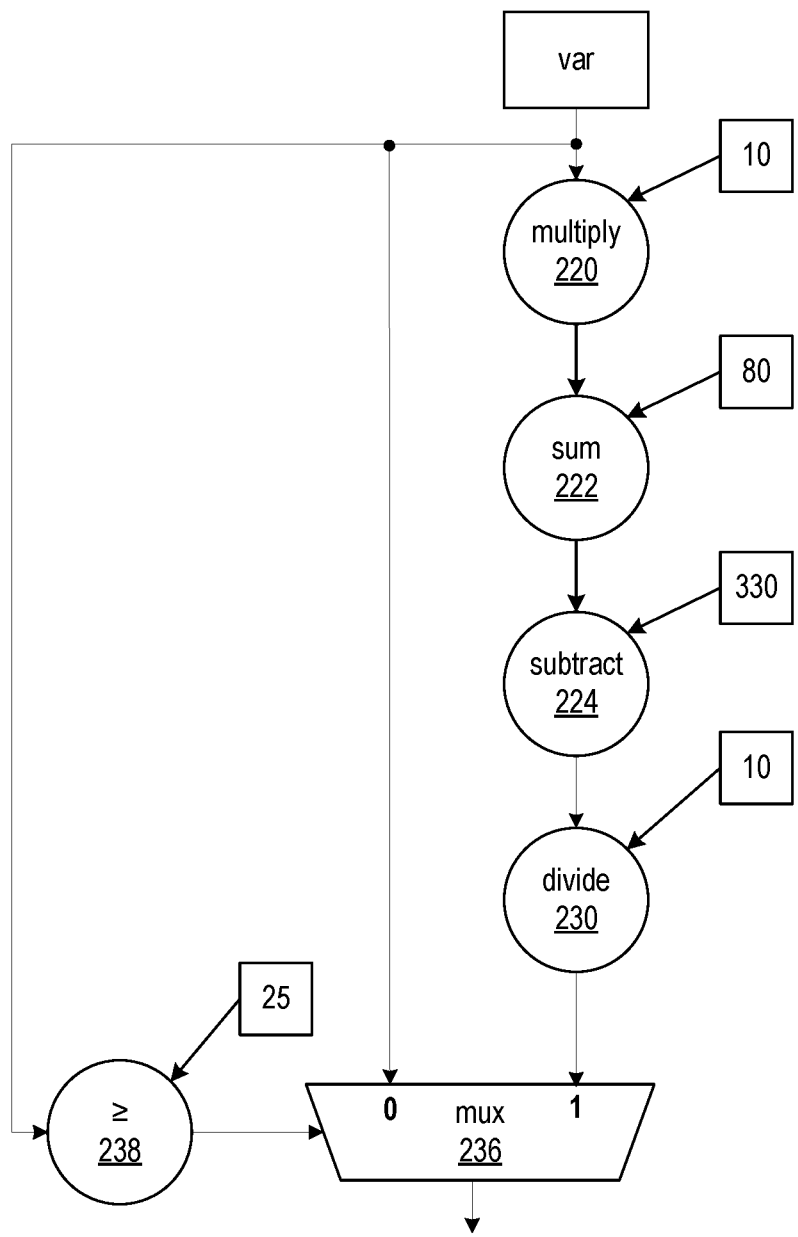
FIG. 4 is the DFG of FIG. 3 after optimization in accordance with the present disclosure.

FIG. 4 is the DFG of FIG. 3 after optimization in accordance with the process of FIG. 2. As compared to the DFG shown in FIG. 3, the optimized DFG shown in FIG. 4 is simpler and streamlined. The optimized circuit design generated from the optimized DFG has improved QoR. The circuit design generated from the DFG shown in FIG. 3 requires 609 LUTs and 34 logic levels. In contrast, optimized circuit design generated from the optimized DFG shown in FIG. 4 requires only 29 LUTs and 6 logic levels, 94.4% and 82.4% reductions, respectively.

Figure 5:
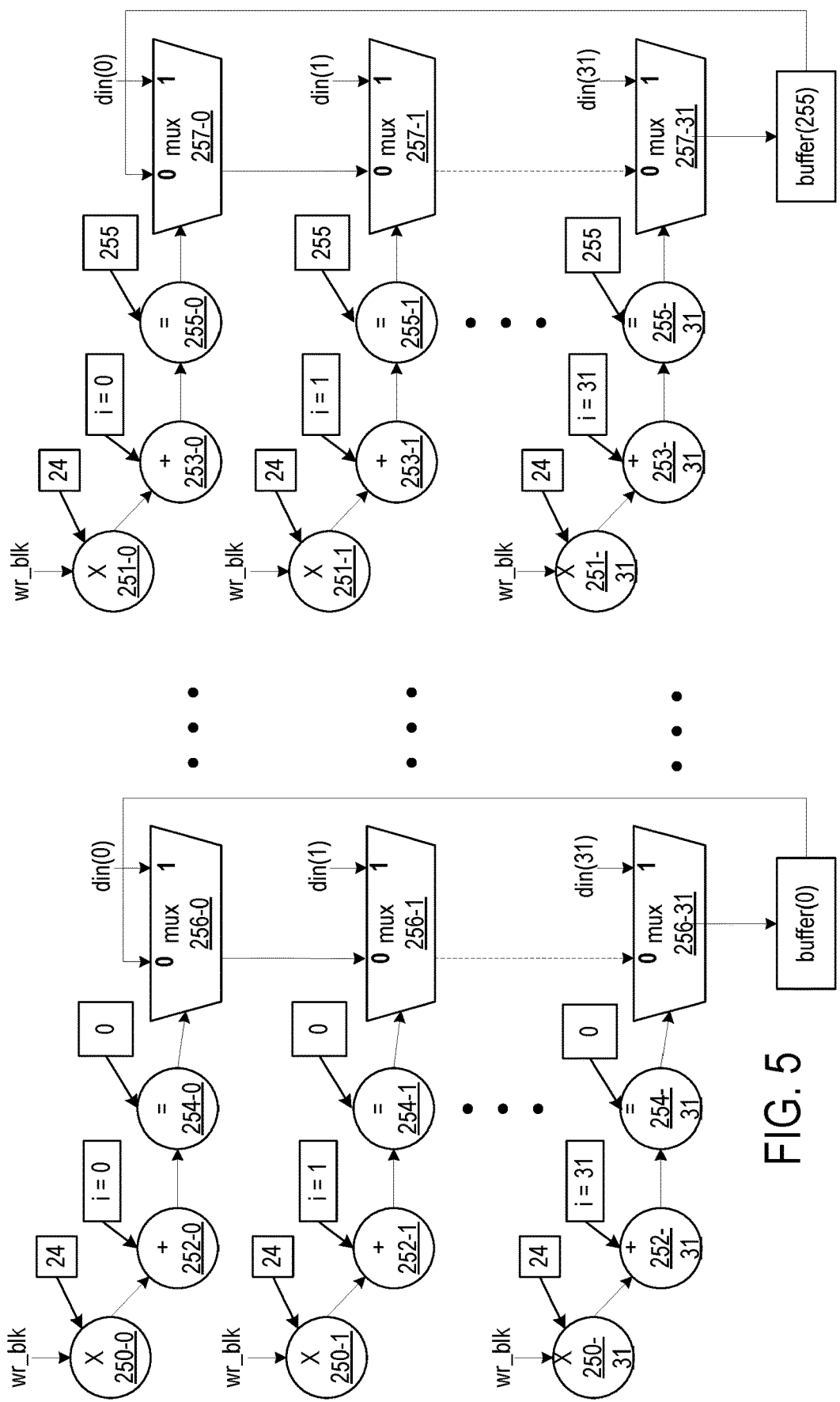
FIG. 5 is an exemplary DFG including a cascading multiplexer structure.

Referring now to FIG. 5, FIG. 5 is an exemplary DFG including a cascading multiplexer structure. The DFG shown in FIG. 5 is generated from the RTL code of Example 2.

type arr_type is array(natural range< >) of std_logic_vector(3 downto 0);
      signal buffer : arr_type(0 to 255);
      variable wr_blk :natural range 0 to 7;
      for i in 0 to 31 loop
      buffer(wr_blk*24+i)<=din(i);
      end loop;

Example 2

The RTL code generates an array "buffer" having a width of 256. The array "buffer" is indexed in a for-loop that has an input variable "wr_blk." The semantics associated with wr_blk specify that the value is a natural number and specify a range of values of wr_blk, 0 to 7. The RTL code defines an input array "din" having a width of thirty-two. For simplicity, the input array din is not shown in FIG. 5.

Depending on the value of wr_blk, each element in buffer receives either an element of din or maintain its current value. The DFG shown in FIG. 5 captures the for-loop with a series of cascading multiplexer nodes. The select logic for each of the multiplexer nodes determines whether the value of the index expression (wr_blk*24+i) is equal to the index of buffer. FIG. 5 shows the cascaded multiplexer structure for writing into buffer. For simplicity, only the cascading multiplexer structure for indices 0 and 255 of buffer and indices 0, 1, and 31 of din is illustrated.

For index 0 of buffer, the selection logic for each multiplexer node 256-0 to 256-31 determines whether the value of the index expression is equal to 0 (represented by the equal-to nodes 254-0 to 254-31). The index expression is represented by the multiply nodes 250-0 to 250-31 and the sum nodes 252-0 to 252-31. For index 256 of buffer, each multiplexer node 257-0 to 257-31 determines whether the value of the index expression is equal to 255 (represented by the equal-to nodes 255-0 to 255-31). The index expression is represented by the multiply nodes 251-0 to 251-31 and the sum nodes 253-0 to 253-31. The condition constraint set is backwards propagated through the nodes of the DFG.

Figure 6:
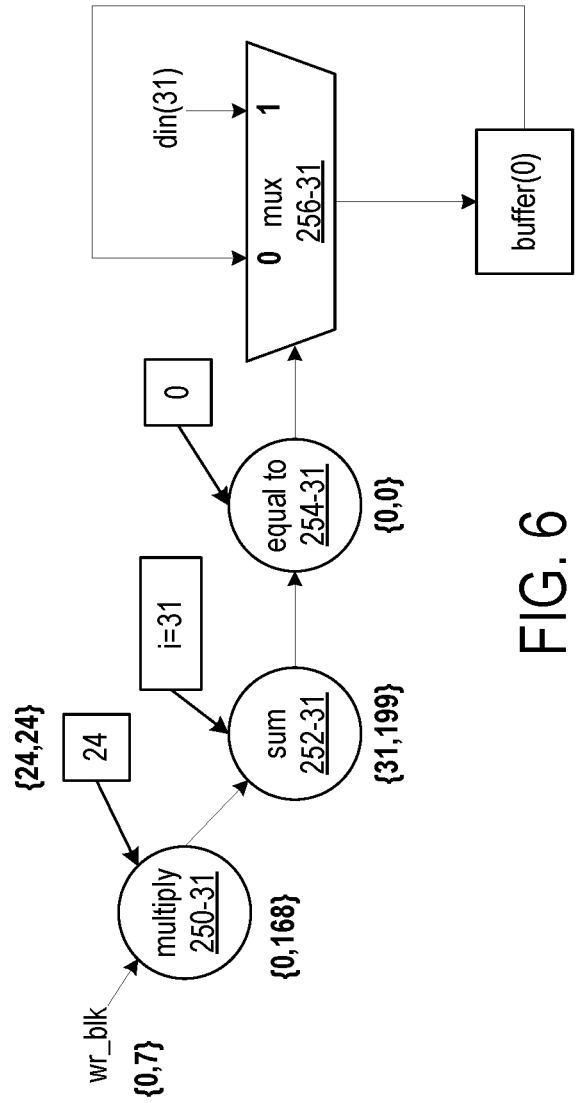
FIG. 6 illustrates range propagation applied one multiplexer node of the DFG of FIG. 5 in accordance with the present disclosure.

FIG. 6 illustrates range propagation applied to one multiplexer node of the DFG of FIG. 5. If the value of wr_blk is zero, then the multiplexer node 256-31 selects the "true" ("1") data input and buffer at index 0 receives the value of din at index 31. If the value of wr_blk is not 0, then the multiplexer node 228 selects the "false" data input ("0") and buffer at index 0 maintains its current value.

Turning again to FIG. 2, at decision block 205, the system determines whether range information associated with the selector input of a multiplexer node restricts selection of a data input of the multiplexer node to only one data input. In the illustrated example of FIG. 6, the initial range of values of wr_blk is 0 to 7. After the multiply node 250-31, the range of values of wr_blk is 0 to 168. After the sum node 252-31, the range of values of wr_blk is 31 to 199. Thus, the value of wr_blk cannot be equal to 0. Consequently, the multiplexer node 256-31 always selects the "false" data input ("0"). At block 206, the system connects the one selected data input of the multiplexer node to each load. In the example of FIG. 6, the "false" ("0") data input of the multiplexer node 256-31 is connected to buffer(0). At block 207, the system removes the multiplexer node, the selector input node(s) of the multiplexer node, and the nodes connected only to the unselected data inputs of the multiplexer node. In the illustrated example of FIG. 6, the multiplexer node 256-31, the equal-to node 254-31, the sum node 252-31, and the multiply node 250-31 are removed from the DFG shown in FIG. 5.

Although FIG. 6 shows and is described in reference to the multiplexer node for index 31 of din and index 0 of buffer, the optimization can be performed on all indices (0 to 255) of buffer and all indices of din (0 to 31). The optimized circuit design generated from the optimized DFG shown in FIG. 6 has improved QoR. For example, the quantity of LUTs in the optimized circuit design can be reduced by 99.9%.

Figure 7:
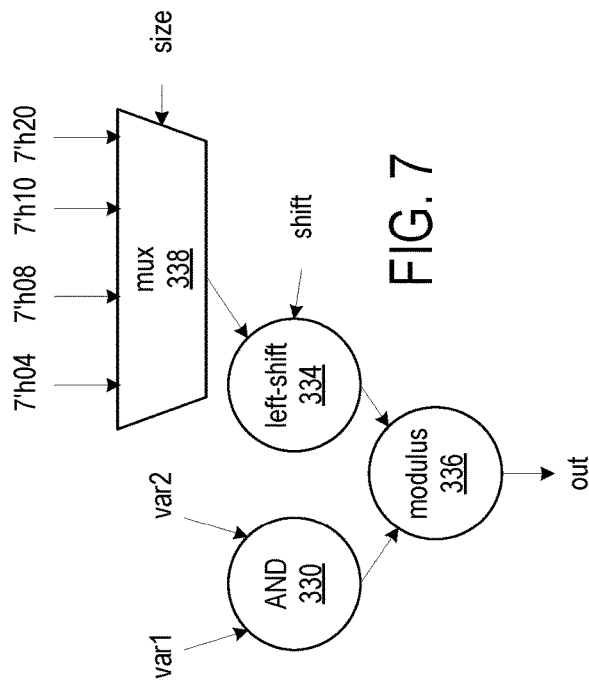
FIG. 7 is an exemplary DFG including a modulus operation prior to optimization.

FIG. 7 is an exemplary DFG including a modulus operation prior to optimization. The DFG shown in FIG. 7 is generated from the RTL code of Example 3.

input [16:0] var1;
    input [16:0] var2;
    input [1:0] selector;
    input shift;

```
output [1:0] out;
logic [6:0] size;
begin
unique case (selector)
  2'h0: size=7'h04;
  2'h1: size=7'h08;
  2'h2: size=7'h10;
  2'h3: size=7'h20;
endcase
end
assign out=!((var1 & var2))%(size<<shift));
```

Example 3

The syntax x'hy represents x bits of hexadecimal digit y. For example, 2'h0 represents 2 bits of hexadecimal 0. In the DFG shown in FIG. 7, the dividend of the modulus operation is the output of the AND node 330, which represents the AND operation, is input to the modulus node 336, which represents the modulus operation. The divisor of the modulus operation is the output of the left-shift node 334, which represents the left-shift operation, is input to the modulus node 336. The multiplexer node 338 represents the case operation.

For any unsigned value of a dividend N, any modulus operation where the value of the divisor is a power of two (N mod (%) (2^M)) can be expressed as N AND (2^M−1). Referring again to FIG. 2, at decision block 208, the system determines whether range information associated with a divisor input of a modulus node is always a power of 2. Turning again to FIG. 7, the output of the multiplexer node 338 is always a power of 2. The output of a left-shift operation on a value that is a power of 2 will remain a power of 2. Thus, the output of the left-shift node 334 will always be a power of 2 and the modulus node 336 can be replaced with a multiplexer node as described above.

In response to determining that a modulus node has a divisor that is always a power of 2, at block 209, the system replaces the modulus node with a multiplexer node. The modulus node is removed from the DFG and a multiplexer node is added to the DFG. The system connects the divisor input of the removed modulus node to the selector input of the multiplexer node. At block 210, the system adds AND nodes to the DFG. A first input of each AND node receives the dividend of the modulus node. A second input of each AND node receives a constant value that is a power of 2 minus 1. The output of the modulus node becomes the output of the multiplexer node.

In response to determining at decision block 208 that the range information associated with divisor inputs of the modulus nodes of the DFG do not specify a divisor that is always a power of 2, at block 214, the EDA system generates configuration data from the DFG, as may have been modified by blocks 206 and 207 or by blocks 212 and 213. At block 215, the EDA system configures a programmable IC with the configuration data.

Figure 8:
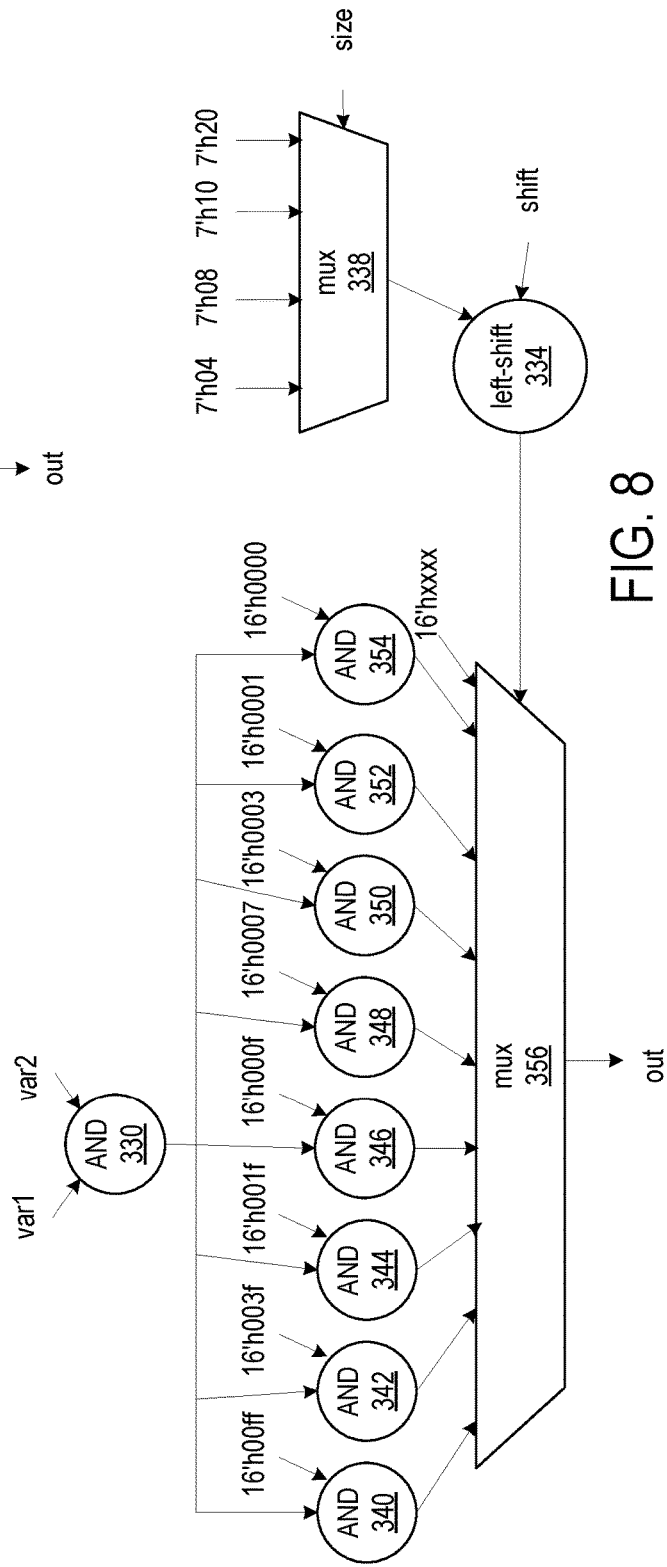
FIG. 8 is the DFG of FIG. 7 after optimization in accordance with the present disclosure.

FIG. 8 is the DFG of FIG. 7 after optimization in accordance with the present disclosure. The modulus node 336 is replaced with the multiplexer node 356. The divisor of the modulus node 336 (the output of the left-shift node 334) is connected to the selector input of the multiplexer node 356. AND nodes 340, 342, 344, 346, 348, 350, and 352 are added to the DFG, and the AND node 330 is removed. A first input of each of the AND nodes 340, 342, 344, 346, 348, 350, and 352 is connected to the dividend input of the removed modulus node 336 (the output of the AND node 330). A second input of each of the AND nodes 340, 342, 344, 346, 348, 350, and 352 receives a constant value that is a power of 2 minus 1. The constant values are 16'h00ff, 16'h003f, 16'h001f, 16'h000f, 16'h0007, 16'h0003, 16'h0001, and 16'h0000, respectively. The output of each of the AND nodes 340, 342, 344, 346, 348, 350, 352, and 354 is connected to one of the data inputs of the multiplexer node 356.

The optimized circuit design generated from the optimized DFG shown in FIG. 8 has improved QoR. For example, the quantity of LUTs in the optimized circuit design can be reduced by 98.7% and the quantity of logic levels can be reduced by 97.1%.

Figure 9:
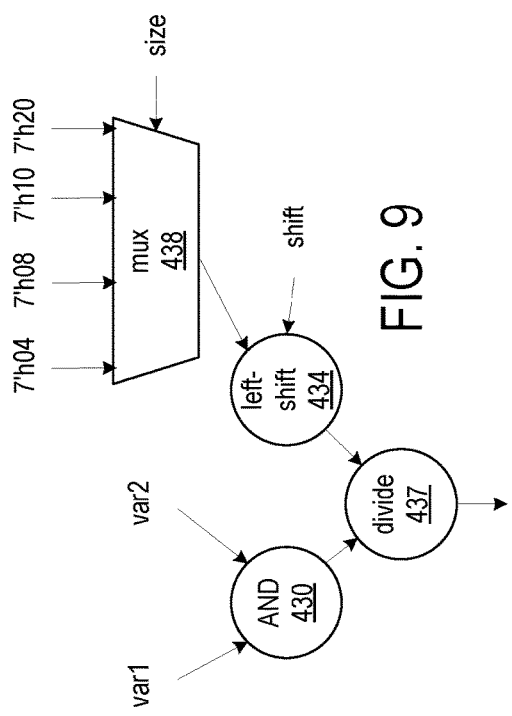
FIG. 9 is an exemplary DFG including a divide operation prior to optimization.

FIG. 9 is an exemplary DFG including a divide operation prior to optimization. The DFG shown in FIG. 9 is generated from the RTL code in Example 4.

```
input [16:0] var1;
input [16:0] var2;
input [1:0] selector;
input shift;
output [1:0] out;
logic [6:0] size;
begin
unique case (selector)
  2'h0: size=7'h04;
  2'h1: size=7'h08;
  2'h2: size=7'h10;
  2'h3: size=7'h20;
endcase
end
assign out=!((var1 & var2))/(size<<shift));
```

Example 4

In the DFG shown in FIG. 8, the dividend of the divide operation, the output of the AND node 430 (representing the AND operation), is input to the divide node 437 (representing the divide operation). The divisor of the divide operation, the output of the left-shift node 434 (representing the left-shift operation), is input to the divide node 437. The multiplexer node 438 represents the case operation.

For any unsigned value of a dividend N, any divide operation where the value of the divisor is a power of two (N div (/) (2^M)) can be expressed as N>>(M−1), which is right-shift N by M−1 bits. Referring again to FIG. 2, at decision block 211, the system determines whether range information associated with a divisor input of a divide node is always a power of 2. In response to determining that a divide node has a divisor that is always a power of 2, at block 212, the system replaces the divide node with a multiplexer node. The divide node is removed from the DFG and a multiplexer node is added to the DFG. The system connects the divisor input of the divide node to the selector input of the multiplexer node. At block 213, the system adds right-shift nodes to the DFG. A first input of each right-shift node inputs the value to be shifted, which is the dividend of the divide node. A second input of each right-shift node receives a constant value that is a power of 2 minus 1 and specifies one of the possible number of bits to shift. The output of the modulus node becomes the output of the multiplexer node.

Turning again to FIG. 9, the output of the multiplexer node 338 is always a power of 2. The output of a left-shift operation on a value that is a power of 2 will remain a power of 2. Thus, the output of the left-shift node 334 will always be a power of 2 and the modulus node 336 can be replaced with a multiplexer node as described above.

In response to determining, at decision block 211, that the range information associated with divisor inputs of the divide nodes of the DFG do not always specify a divisor that is a power of 2, at block 214, the EDA system generates configuration data from the DFG which may or may not have been optimized by removing unneeded multiplexers and/or optimizing modulus operations. At block 215, the EDA system configures a programmable IC with the configuration data to generate a functional circuit.

Figure 10:
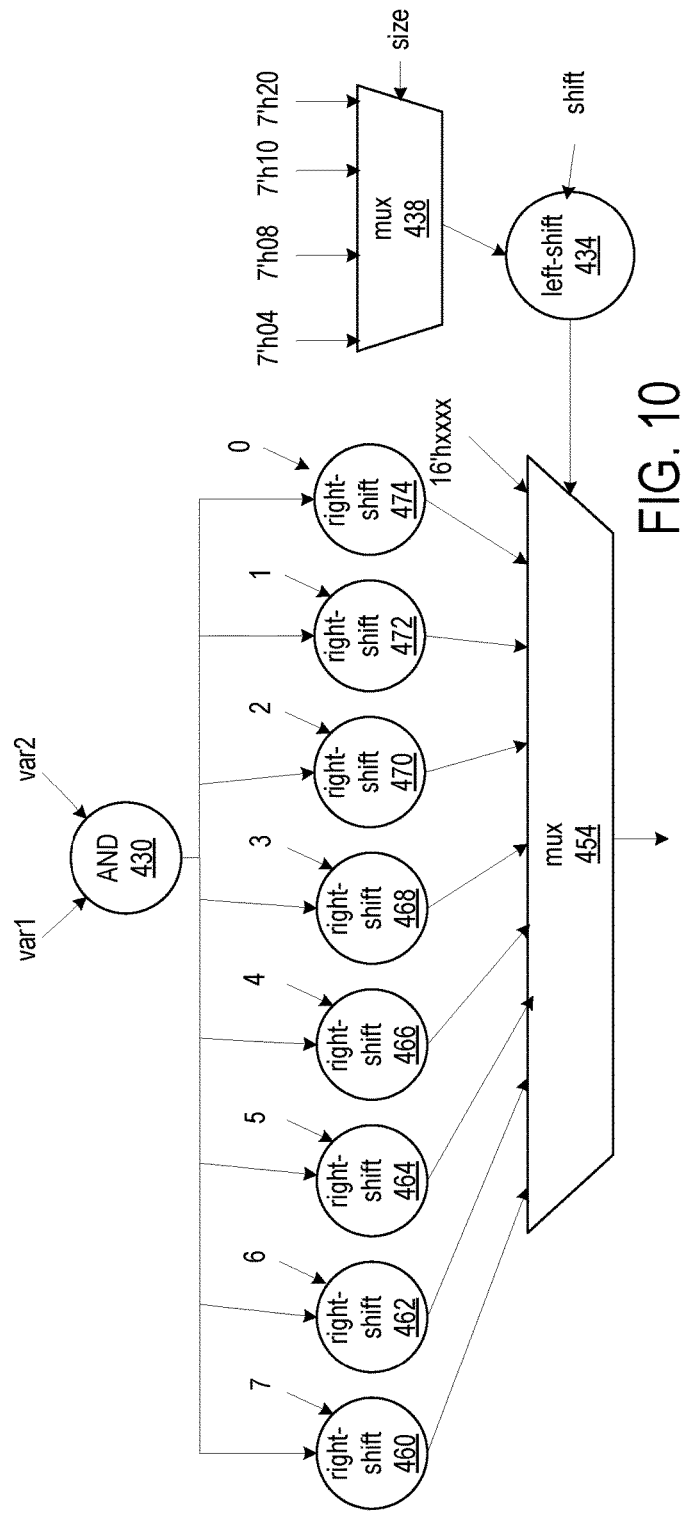
FIG. 10 is the DFG of FIG. 9 after optimization in accordance with the present disclosure.

FIG. 10 is the DFG of FIG. 9 after optimization in accordance with the present disclosure. The divide node 437 is replaced with the multiplexer node 454. The divisor of the divide node 437 (the output of the left-shift node 434) is connected to the selector input of the multiplexer node 454. Right-shift nodes 460, 462, 464, 466, 468, 470, and 472 are added to the DFG. A first input of each of the right-shift nodes 460, 462, 464, 466, 468, 470, and 472 is connected to the dividend of the divide node 437, which is the output of the AND node 430 and is the value to be shifted. A second input of each of the right-shift nodes 460, 462, 464, 466, 468, 470, and 472 inputs a constant value that is one of the possible values of a power of 2 minus 1 and is the number of bits to shift. The constant values are 7, 6, 5, 4, 3, 2, 1, and 0, respectively. The output of each of the right-shift nodes 460, 462, 464, 466, 468, 470, 472, and 474 is connected to one of the data inputs of the multiplexer node 454.

The optimized circuit design generated from the optimized DFG shown in FIG. 10 has improved QoR. For example, the quantity of LUTs in the optimized circuit design can be reduced by 98.7% and the quantity of logic levels can be reduced by 97.1%.

Referring back to FIG. 2, after a DFG has been optimized with respect to the multiplexer nodes, the modulus nodes, and the divide nodes of the DFG as described above in association with FIGS. 2-10, at block 214, the system generates configuration data from the optimized DFG. At block 215, the system configures a programmable IC with the configuration data to generate a functional circuit.

Figure 11:
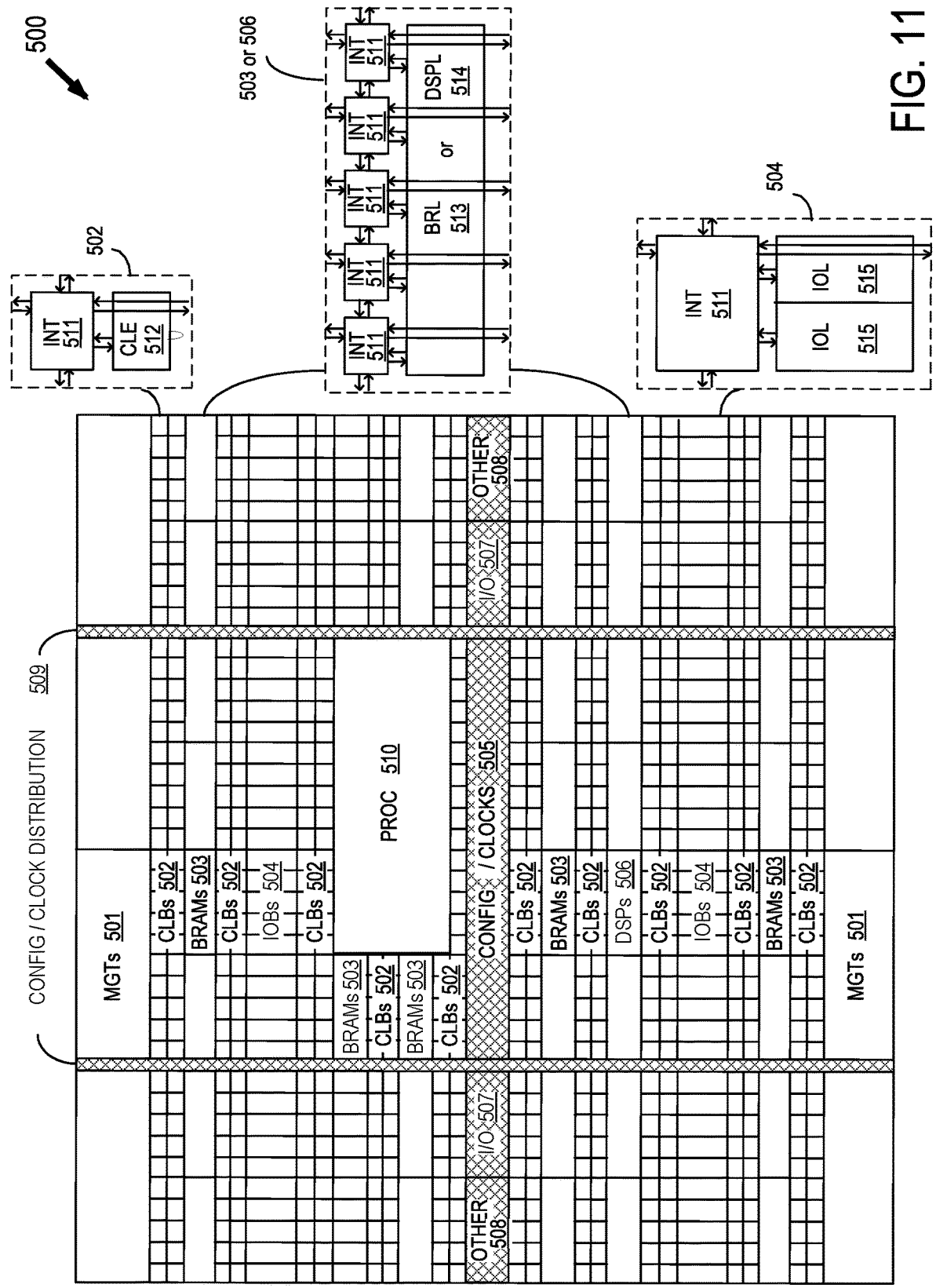
FIG. 11 illustrates an FPGA implementation of a programmable integrated circuit (IC)

FIG. 11 shows a programmable integrated circuit (IC) 500 on which a circuit designs generated from an optimized DFG may be implemented. The programmable IC may also be referred to as a System On Chip (SOC) that includes field programmable gate array logic (FPGA) along with other programmable resources. FPGA logic may include several different types of programmable logic blocks in the array. For example, FIG. 11 illustrates programmable IC 500 that includes a large number of different programmable tiles including multi-gigabit transceivers (MGTs) 501, configurable logic blocks (CLBs) 502, random access memory blocks (BRAMs) 503, input/output blocks (IOBs) 504, configuration and clocking logic (CONFIG/CLOCKS) 505, digital signal processing blocks (DSPs) 506, specialized input/output blocks (I/O) 507, for example, clock ports, and other programmable logic 508 such as digital clock managers, analog-to-digital converters, system monitoring logic, and so forth. Some programmable IC having FPGA logic also include dedicated processor blocks (PROC) 510 and internal and external reconfiguration ports (not shown).

In some FPGA logic, each programmable tile includes a programmable interconnect element (INT) 511 having standardized connections to and from a corresponding interconnect element in each adjacent tile. Therefore, the programmable interconnect elements taken together implement the programmable interconnect structure for the illustrated FPGA logic. The INT 511 also includes the connections to and from the programmable logic element within the same tile, as shown by the examples included at the top of FIG. 11.

For example, a CLB 502 can include a configurable logic element CLE 512 that can be programmed to implement user logic, plus a single INT 511. A BRAM 503 can include a BRAM logic element (BRL) 513 in addition to one or more programmable interconnect elements. Typically, the number of interconnect elements included in a tile depends on the height of the tile. The illustrated BRAM tile has the same height as five CLBs, but other numbers (e.g., four) can also be used. A DSP tile 506 can include a DSP logic element (DSPL) 514 in addition to an appropriate number of programmable interconnect elements. An 10B 504 can include, for example, two instances of an input/output logic element (IOL) 515 in addition to one instance of the INT 511. As will be clear to those of skill in the art, the actual I/O bond pads connected, for example, to the IOL 515, are manufactured using metal layered above the various illustrated logic blocks, and typically are not confined to the area of the IOL 515.

A columnar area near the center of the die (shown shaded in FIG. 11) is used for configuration, clock, and other control logic. Horizontal areas 509 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 11 include additional logic blocks that disrupt the regular columnar structure making up a large part of the programmable IC. The additional logic blocks can be programmable blocks and/or dedicated logic. For example, the processor block PROC 510 shown in FIG. 11 spans several columns of CLBs and BRAMs.

Note that FIG. 11 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 11 are purely exemplary. For example, in an actual programmable IC, more than one adjacent column of CLBs is typically included wherever the CLBs appear, to facilitate the efficient implementation of user logic.

Figure 12:
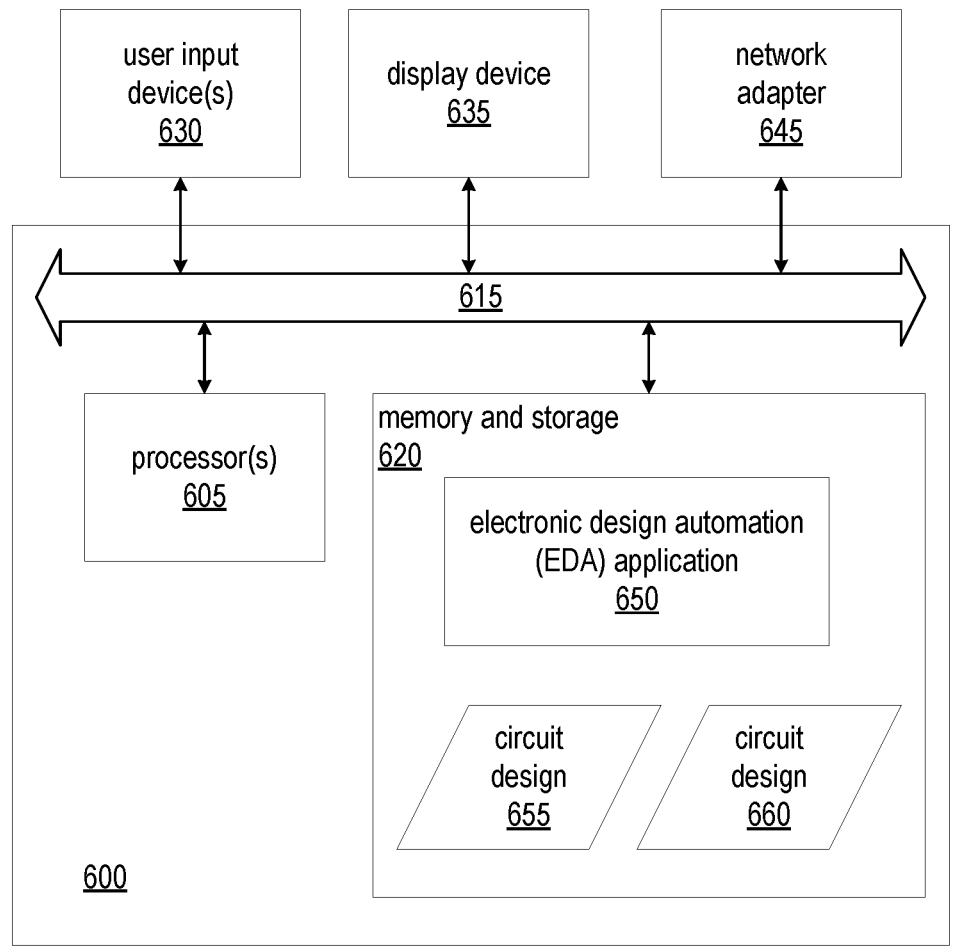
FIG. 12 illustrates a block diagram illustrating an exemplary data processing system.

FIG. 12 is a block diagram illustrating an exemplary data processing system (system) 600. System 600 is an example of an EDA system. As pictured, system 600 includes at least one processor circuit (or "processor"), e.g., a central processing unit (CPU) 605 coupled to memory and storage arrangement 620 through a system bus 615 or other suitable circuitry. System 600 stores program code and circuit design 100 within memory and storage arrangement 620. Processor 605 executes the program code accessed from the memory and storage arrangement 620 via system bus 615. In one aspect, system 600 is implemented as a computer or other data processing system that is suitable for storing and/or executing program code. It should be appreciated, however, that system 600 can be implemented in the form of any system including a processor and memory that is capable of performing the functions described within this disclosure.

Memory and storage arrangement 620 includes one or more physical memory devices such as, for example, a local memory (not shown) and a persistent storage device (not shown). Local memory refers to random access memory or other non-persistent memory device(s) generally used during actual execution of the program code. Persistent storage can be implemented as a hard disk drive (HDD), a solid state drive (SSD), or other persistent data storage device. System 600 may also include one or more cache memories (not shown) that provide temporary storage of at least some program code and data in order to reduce the number of times program code and data must be retrieved from local memory and persistent storage during execution.

Input/output (I/O) devices such as user input device(s) 630 and a display device 635 may be optionally coupled to system 600. The I/O devices may be coupled to system 600 either directly or through intervening I/O controllers. A network adapter 645 also can be coupled to system 600 in order to couple system 600 to other systems, computer systems, remote printers, and/or remote storage devices through intervening private or public networks. Modems, cable modems, Ethernet cards, and wireless transceivers are examples of different types of network adapter 645 that can be used with system 600.

Memory and storage arrangement 620 may store an EDA application 650. EDA application 650, being implemented in the form of executable program code, is executed by processor(s) 605. As such, EDA application 650 is considered part of system 600. System 600, while executing EDA application 650, receives and operates on circuit design 655. In one aspect, system 600 performs a design flow on circuit design 655, and the design flow can include synthesis, mapping, placement, routing, and the application of the approaches for optimizing the timing of a circuit design as described herein. System 600 generates an optimized, or modified, version of circuit design 655 as circuit design 660. Circuit design 655 can be analogous to a circuit design generated from the DFGs shown in FIGS. 3, 5, 7, and 9 (not optimized). Circuit design 660 can be analogous to a circuit design generated from the DFGs shown in FIGS. 4, 8, and 10 (optimized).

EDA application 650, circuit design 100, circuit design 660, and any data items used, generated, and/or operated upon by EDA application 650 are functional data structures that impart functionality when employed as part of system 600 or when such elements, including derivations and/or modifications thereof, are loaded into an IC such as a programmable IC causing implementation and/or configuration of a circuit design within the programmable IC.

Though aspects and features may in some cases be described in individual figures, it will be appreciated that features from one figure can be combined with features of another figure even though the combination is not explicitly shown or explicitly described as a combination.

The disclosed methods and system are thought to be applicable to a variety of systems for preparing and/or maintaining circuit designs. Other aspects and features will be apparent to those skilled in the art from consideration of the specification. It is intended that the specification and drawings be considered as examples only, with a true scope of the invention being indicated by the following claims.

What is claimed is:

1. A method, comprising:
performing, by a programmed computer, operations including:
determining range information for each variable of a circuit design;
propagating the range information from inputs to outputs of nodes of a data flow graph (DFG) representation of the circuit design;
for each multiplexer of the circuit design represented as a respective multiplexer node in the DFG, determining whether range information associated with a selector input of the multiplexer node restricts selection of data inputs of the multiplexer node to only one selected data input of the multiplexer node; and in response to determining that range information associated with the selector input restricts selection of data inputs of the multiplexer node to only one data input, modifying the DFG by:
connecting the selected data input of the respective multiplexer node to each load of the respective multiplexer node; and
removing from the DFG, the respective multiplexer node, a corresponding select logic node of the respective multiplexer node, and one or more nodes connected to one or more unselected data inputs of the respective multiplexer node.

2. The method of claim 1, wherein the operations performed by the programmed computer further include:
generating, from the modified DFG, configuration data that implements the circuit design; and
configuring a programmable IC with the configuration data to implement the circuit design on the programmable IC.

3. The method of claim 1, wherein the operations performed by the programmed computer further include:
determining each modulus node in the DFG that corresponds to a modulus operation in the circuit design;
for a modulus node in the DFG, from the range information associated with a divisor input that corresponds to a divisor of the modulus node, determining whether the range information specifies a divisor that is always a power of two; and
in response to determining that the range information of the input that corresponds to the divisor input specifies a divisor that is always a power of two, modifying the DFG by replacing the modulus node with:
a multiplexer node having a plurality of data inputs and a selector input connected to the divisor input, and
a plurality of AND nodes, each AND node having a first input coupled to receive a dividend of the modulus operation, a second input coupled to receive a constant value that is one of possible values of the divisor minus 1, and an output coupled to a data input of the multiplexer node.

4. The method of claim 1, wherein the operations performed by the programmed computer further include:
determining each divide node in the DFG that corresponds to a divide operation in the circuit design;
determining for a divide node, from the range information associated with a divisor input that corresponds to a divisor of the divide node, whether the range information specifies a divisor that is always a power of two; and
in response to determining that the range information of the divisor input that corresponds to the divisor of the divide operation specifies a divisor that is always a power of two, modifying the DFG by replacing the divide node with:
a multiplexer node having a plurality of data inputs and a selector input connected to the divisor input, and
a plurality of right-shift nodes, each right-shift node having a first input coupled to receive a dividend of the divide operation, a second input coupled to receive a constant value that is one of possible values of the divisor minus 1, and an output coupled to a data input of the multiplexer node.

5. The method of claim 1, wherein:
the operations performed by the programmed computer further include identifying, for each data input of at least one multiplexer node in the DFG, a respective conditional block that is a logic cone of the data input;

determining the range information includes associating with each respective conditional block, a condition constraint set that includes one or more values of each of one or more variables associated with a selector input of the at least one multiplexer node;

the one or more values of each of the one or more variables indicate selection by the at least one multiplexer node of the data input of the respective conditional block; and propagating the range information includes propagating the condition constraint set from inputs to outputs of nodes in the respective conditional block.

6. The method of claim 5, wherein:

identifying the respective conditional block includes traversing nodes of the DFG in reverse topological order starting from a data input of each node; and propagating the condition constraint set includes traversing the nodes of the DFG in reverse topological order starting from an output of the DFG.

7. The method of claim 1, wherein determining the range information for each variable of the circuit design includes determining minimum and maximum values for each variable based on semantics associated with each variable.

8. A method, comprising:

performing, by a programmed computer, operations including:

determining range information for each variable of a circuit design;

propagating the range information from inputs to outputs of nodes of a data flow graph (DFG) representation of the circuit design;

determining each modulus node in the DFG that corresponds to a modulus operation in the circuit design;

for a modulus node in the DFG, from the range information associated with a divisor input that corresponds to a divisor of the modulus node, determining whether the range information specifies a divisor that is always a power of two; and in response to determining that the range information of the divisor input that corresponds to the divisor input specifies a divisor that is always a power of two, modifying the DFG by replacing the modulus node with:

a multiplexer node having a plurality of data inputs and a selector input connected to the divisor input, and a plurality of AND nodes, each AND node having a first input coupled to receive a dividend of the modulus operation, a second input coupled to receive a constant value that is one of possible values of the divisor minus 1, and an output coupled to a data input of the multiplexer node.

9. The method of claim 8, wherein the operations performed by the programmed computer further include:

generating, from the modified DFG, configuration data that implements the circuit design; and configuring a programmable IC with the configuration data to implement the circuit design on the programmable IC.

10. The method of claim 8, wherein the operations performed by the programmed computer further include:

determining each multiplexer node in the DFG that corresponds to a multiplexer in the circuit design;

for a multiplexer node in the DFG, determining whether range information associated with a selector input of the multiplexer node restricts selection of data inputs of the multiplexer node to only one selected data input of the multiplexer node; and in response to determining that range information associated with the selector input restricts selection of data inputs of the multiplexer node to only one data input, modifying the DFG by:

connecting the selected data input of the respective multiplexer node to each load of the respective multiplexer node; and removing from the DFG, the multiplexer node, a corresponding select logic node of the multiplexer node, and one or more nodes connected to one or more unselected data inputs of the respective multiplexer node.

11. The method of claim 8, wherein the operations performed by the programmed computer further include:

determining each divide node in the DFG that corresponds to a divide operation in the circuit design;

determining for a divide node, from the range information associated with a divisor input that corresponds to a divisor of the divide node, whether the range information specifies a divisor that is always a power of two; and in response to determining that the range information of the divisor input specifies a divisor that is always a power of two, modifying the DFG by replacing the divide node with:

a multiplexer node having a plurality of data inputs and a selector input connected to the divisor input, and a plurality of right-shift nodes, each right-shift node having a first input coupled to receive a dividend of the divide operation, a second input coupled to receive a constant value that is one of possible values of the divisor minus 1, and an output coupled to a data input of the multiplexer node.

12. The method of claim 8, wherein:

the operations performed by the programmed computer further include identifying, for each data input of at least one multiplexer node in the DFG, a respective conditional block that is a logic cone of the data input;

determining the range information includes associating with each respective conditional block, a condition constraint set that includes one or more values of each of one or more variables associated with a selector input of the at least one multiplexer node;

the one or more values of each of the one or more variables indicate selection by the at least one multiplexer node of the data input of the respective conditional block; and propagating the range information includes propagating the condition constraint set from inputs to outputs of nodes in the respective conditional block.

13. The method of claim 12, wherein:

identifying the respective conditional block includes traversing nodes of the DFG in reverse topological order starting from a data input of each node; and propagating the condition constraint set includes traversing the nodes of the DFG in reverse topological order starting from an output of the DFG.

14. A system, comprising:

a computer system including:

a processor; and a memory configured with instructions that when executed by the processor cause the processor to perform operations including:

determining range information for each variable of a circuit design;

propagating the range information from inputs to outputs of nodes of a data flow graph (DFG) representation of the circuit design;

determining each divide node in the DFG that corresponds to a divide operation in the circuit design;

determining for a divide node, from the range information associated with a divisor input that corresponds to a divisor of the divide node, whether the range information specifies a divisor that is always a power of two; and in response to determining that the range information of the divisor input specifies a divisor that is always a power of two, modifying the DFG by replacing the divide node with:
  a multiplexer node having a plurality of data inputs and a selector input connected to the divisor input, and
  a plurality of right-shift nodes, each right-shift node having a first input coupled to receive a dividend of the divide operation, a second input coupled to receive a constant value that is one of possible values of the divisor minus 1, and an output coupled to a data input of the multiplexer node.

15. The system of claim 14, wherein the memory is configured with instructions that when executed by the processor cause the processor to perform operations including:

generating, from the modified DFG, configuration data that implements the circuit design; and configuring a programmable IC with the configuration data to implement the circuit design on the programmable IC.

16. The system of claim 14, wherein the memory is configured with instructions that when executed by the processor cause the processor to perform operations including:

determining each multiplexer node in the DFG that corresponds to a multiplexer in the circuit design;

for a multiplexer node in the DFG, determining whether range information associated with a selector input of the multiplexer node restricts selection of data inputs of the multiplexer node to only one selected data input of the multiplexer node; and in response to determining that range information associated with the selector input restricts selection of data inputs of the multiplexer node to only one data input, modifying the DFG by:
  connecting the selected data input of the respective multiplexer node to each load of the respective multiplexer node; and
  removing from the DFG, the respective multiplexer node, a corresponding select logic node of the respective multiplexer node, and one or more nodes connected to one or more unselected data inputs of the respective multiplexer node.

17. The system of claim 14, wherein the memory is configured with instructions that when executed by the processor cause the processor to perform operations including:

determining each modulus node in the DFG that corresponds to a modulus operation in the circuit design;

for a modulus node in the DFG, from the range information associated with a divisor input that corresponds to a divisor of the modulus node, determining whether the range information specifies a divisor that is always a power of two; and in response to determining that the range information of the divisor input specifies a divisor that is always a power of two, modifying the DFG by replacing the modulus node with:
  a multiplexer node having a plurality of data inputs and a selector input connected to the divisor input, and
  a plurality of AND nodes, each AND node having a first input coupled to receive a dividend of the modulus operation, a second input coupled to receive a constant value that is one of possible values of the divisor minus 1, and an output coupled to a data input of the multiplexer node.

18. The system of claim 14, wherein:

the memory is configured with instructions that when executed by the processor cause the processor to perform operations including identifying, for each data input of at least one multiplexer node in the DFG, a respective conditional block that is a logic cone of the data input;

determining the range information includes associating with each respective conditional block, a condition constraint set that includes one or more values of each of one or more variables associated with a selector input of the at least one multiplexer node;

the one or more values of each of the one or more variables indicate selection by the at least one multiplexer node of the data input of the respective conditional block; and propagating the range information includes propagating the condition-constraint set from inputs to outputs of nodes in the respective conditional block.

19. The system of claim 18, wherein:

identifying the respective conditional block includes traversing nodes of the DFG in reverse topological order starting from a data input of each node; and propagating the condition constraint set includes traversing the nodes of the DFG in reverse topological order starting from an output of the DFG.

20. The system of claim 14, wherein determining the range information for each variable of the circuit design includes determining minimum and maximum values for each variable based on semantics associated with each variable.

* * * * *